(12) United States Patent
Jia et al.

(10) Patent No.: US 11,482,138 B2
(45) Date of Patent: Oct. 25, 2022

(54) ELECTROLUMINESCENT DISPLAY PANEL, METHOD FOR MANUFACTURING THE SAME, AND DISPLAY DEVICE

(71) Applicant: BOE TECHNOLOGY GROUP CO., LTD., Beijing (CN)

(72) Inventors: Congcong Jia, Beijing (CN); Xiaojin Zhang, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 200 days.

(21) Appl. No.: 16/958,829

(22) PCT Filed: Dec. 25, 2019

(86) PCT No.: PCT/CN2019/128275
§ 371 (c)(1),
(2) Date: Jun. 29, 2020

(87) PCT Pub. No.: WO2020/168822
PCT Pub. Date: Aug. 27, 2020

(65) Prior Publication Data
US 2020/0410910 A1    Dec. 31, 2020

(30) Foreign Application Priority Data

Feb. 22, 2019 (CN) .......................... 201910131823.0

(51) Int. Cl.
*G09F 9/30* (2006.01)
*H01L 51/00* (2006.01)
(Continued)

(52) U.S. Cl.
CPC .......... *G09F 9/301* (2013.01); *H01L 27/3258* (2013.01); *H01L 51/0097* (2013.01);
(Continued)

(58) Field of Classification Search
None
See application file for complete search history.

(56) References Cited

U.S. PATENT DOCUMENTS

2018/0175310 A1    6/2018  Lee et al.
2019/0140025 A1*   5/2019  Wang ................... H01L 27/326

FOREIGN PATENT DOCUMENTS

CN    103713436 A    4/2014
CN    106548713 A    3/2017
(Continued)

OTHER PUBLICATIONS

Chinese First Office Action dated Feb. 27, 2020, relating to CN Patent Application No. 201910131823.0.
(Continued)

*Primary Examiner* — J. E. Schoenholtz
(74) *Attorney, Agent, or Firm* — Dinsmore & Shohl LLP

(57) ABSTRACT

An electroluminescent display panel, a method for manufacturing the same, and a display device are disclosed, wherein the electroluminescent display panel comprises a bending region and a non-bending region, a plurality of first pixels arranged in an array are provided in the non-bending region, a plurality of second pixels arranged in an array are provided in the bending region, and an open area of the second pixels is smaller than that of the first pixels; in the bending region, at least one elastic region with an extending direction consistent with a bending axis direction is provided at a gap of the second pixels along a direction perpendicular to the bending axis direction, a groove is provided in an insulating composite film layer in each of the elastic region, and the insulating composite film layer comprises a planarization layer and a pixel definition layer positioned over the planarization layer; an elastic member is filled in the groove, which has an elastic modulus greater than that of the planarization layer.

11 Claims, 6 Drawing Sheets

(51) Int. Cl.
*H01L 51/56* (2006.01)
*H01L 27/32* (2006.01)
*H01L 51/52* (2006.01)

(52) U.S. Cl.
CPC ............ *H01L 51/56* (2013.01); *H01L 51/003* (2013.01); *H01L 51/5253* (2013.01); *H01L 2251/105* (2013.01); *H01L 2251/5338* (2013.01)

(56) References Cited

FOREIGN PATENT DOCUMENTS

| | | |
|---|---|---|
| CN | 106601133 A | 4/2017 |
| CN | 106856206 A | 6/2017 |
| CN | 106910823 A | 6/2017 |
| CN | 107204357 A | 9/2017 |
| CN | 108039120 A | 5/2018 |
| CN | 108346377 A | 7/2018 |
| CN | 108539016 A | 9/2018 |
| CN | 108598138 A | 9/2018 |
| CN | 108807485 A | 11/2018 |
| CN | 108922911 A | 11/2018 |
| CN | 108962026 A | 12/2018 |
| CN | 109830184 A | 5/2019 |

OTHER PUBLICATIONS

Chinese Second Office Action dated Nov. 6, 2020, relating to CN Patent Application No. 201910131823.0.

\* cited by examiner

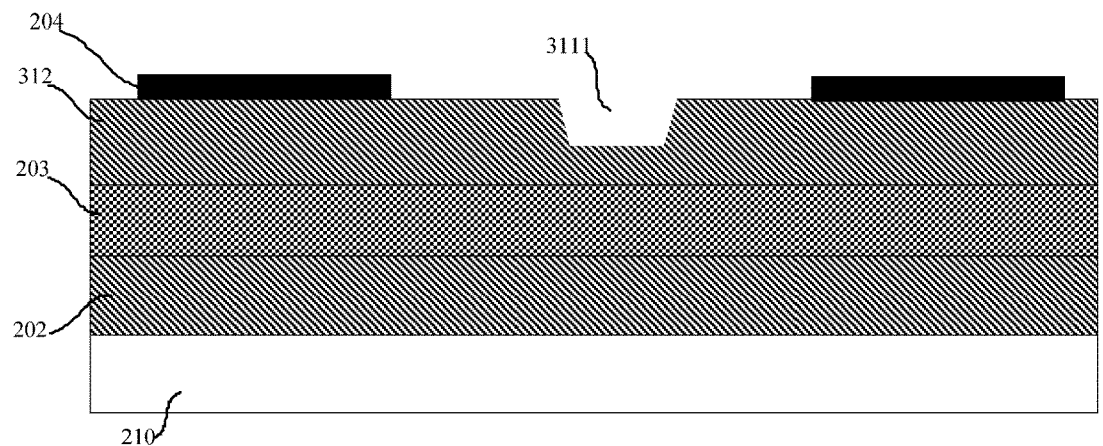
Fig. 3a
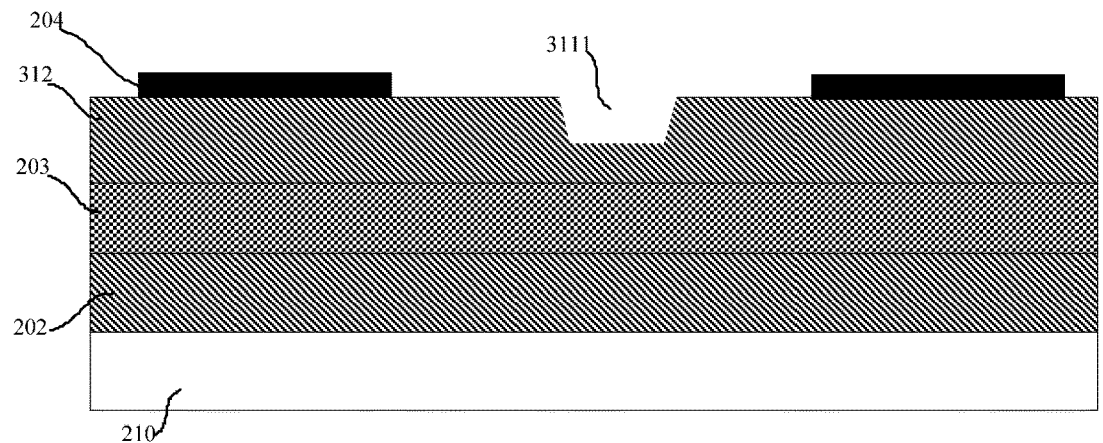
Fig. 3b
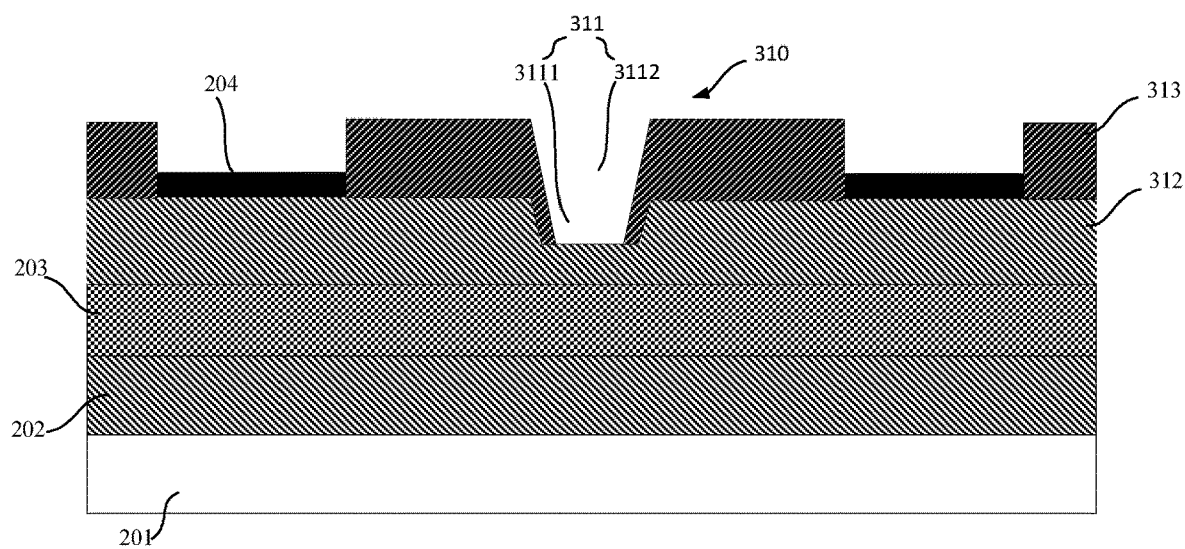
Fig. 3c1

Fig. 3c2

ELECTROLUMINESCENT DISPLAY PANEL, METHOD FOR MANUFACTURING THE SAME, AND DISPLAY DEVICE

CROSS REFERENCE TO RELATED APPLICATIONS

This application is a U.S. National Stage Application under 35 U.S.C. § 371 of International Patent Application No. PCT/CN2019/128275, filed on Dec. 25, 2019, which claims priority from Chinese Patent Application No. 201910131823.0 filed on Feb. 22, 2019, the disclosures of which are incorporated herein by reference in their entirety.

TECHNICAL FIELD

The application relates to an electroluminescent display panel, a method for manufacturing the same, and a display device.

BACKGROUND

In the field of display technology, Organic Light-Emitting Diode (OLED) displays are considered as the third generation display technology following Liquid Crystal Displays (LCDs) due to their numerous advantages of lightness, thinness, self-luminescence, low driving voltage, high luminous efficiency, fast response speed, wide viewing angle, rich colors, high brightness, low power consumption, high and low temperature resistance, etc.

With development of the OLED technology, a flexible display screen manufactured by using the advantage of the flexibility of the OLED becomes a focus of research in recent years and is gradually commercialized. At present, some manufacturers have manufactured bendable OLED screens, but a problem that a bending region is easy to break exists during the testing and using processes of the OLED screens, which affects viewing experience of the user, and shortens the service life of the OLED display.

Therefore, it is very important to provide an electroluminescent display panel with good bending performance and a method for manufacturing the same.

SUMMARY

The disclosure provides the following technical solutions:

an electroluminescent display panel comprising a bending region and a non-bending region, wherein a plurality of first pixels which are arranged in an array are provided in the non-bending region, a plurality of second pixels which are arranged in an array are provided in the bending region, and an open area of the second pixels is smaller than that of the first pixels; in the bending region, at least one elastic region with an extending direction consistent with a bending axis direction is provided at a gap of the second pixels along a direction perpendicular to the bending axis direction, a groove is provided in an insulating composite film layer in each of the elastic region, and the insulating composite film layer comprises a planarization layer and a pixel definition layer positioned over the planarization layer; an elastic member is filled in the groove, and the elastic member has an elastic modulus greater than that of the planarization layer.

In the above electroluminescent display panel, the plurality of first pixels are arranged in the array, which are distributed uniformly, and the open area of the first pixels is fixed, and since the open area of the second pixels is smaller than that of the first pixels, an area of a region for arranging the second pixels in the whole electroluminescent display panel is reduced, thereby ensuring that there is a certain space for providing the elastic region in the bending region; and since the groove is provided in the insulating composite film layer in each of the elastic region, the elastic member is filled in the groove, and the elastic modulus of the elastic member is greater than that of the planarization layer, so that the elastic region has a better bending performance than other portions of the bending region, thereby improving the bendable degree of the whole electroluminescent display panel at the time of bending, addressing the problem of device breakage due to bending, and improving the product yield.

According to some embodiments of the present disclosure, in the elastic region, the planarization layer has a first groove, and the pixel definition layer has a through hole; or, in the elastic region, the planarization layer has a first groove, and the pixel definition layer has a second groove.

According to some embodiments of the present disclosure, in the bending region, the open area of the second pixels which are closer to the bending axis is gradually decreased, and the open area of the groove which is closer to the bending axis is gradually increased; or, in the bending region, the respective second pixels have a uniform open area, and the respective grooves have a uniform open area.

According to some embodiments of the present disclosure, third pixels having the same open area as the first pixels are further provided in the bending region, and respective groups of the third pixels and grooves along a direction consistent with the bending axis direction are alternately provided at gaps of the respective groups of the second pixels along a direction consistent with the bending axis direction.

According to some embodiments of the application, the first pixels and the second pixels are respectively connected to different driving chips.

According to some embodiments of the present disclosure, a material of the planarization layer is polyimide, and a material of the elastic member is modified polyimide.

According to some embodiments of the application, a material of the elastic member is the same as that of a flexible encapsulation film layer.

In addition, the present disclosure also provides a display device comprising the electroluminescent display panel according to any one of the above technical solutions.

In addition, the present disclosure also provides a method for manufacturing the electroluminescent display panel according to any one of the above technical solutions, comprising:

forming the groove in the insulating composite film layer, which is configured by the planarization layer and the pixel definition layer, in the elastic region while forming the planarization layer and the pixel definition layer in sequence; and filling the elastic member in the groove.

According to some embodiments of the present disclosure, forming the groove in the insulating composite film layer, which is configured by the planarization layer and the pixel definition layer, in the elastic region comprises:

forming the planarization layer having a first groove in the elastic region; and forming the pixel definition layer having a second groove or a through hole in the elastic region.

According to some embodiments of the application, filling the elastic member in the groove comprises:

separately forming the elastic member only in the groove after the pixel definition layer is manufactured; or, forming the elastic member in the groove while forming a flexible encapsulation film layer.

BRIEF DESCRIPTION OF THE DRAWINGS

FIGS. 3a-3f are schematic diagrams illustrating states of a method for manufacturing the electroluminescent display panel according to the present disclosure.

DETAILED DESCRIPTION

The technical solutions in the embodiments of the present disclosure will be described clearly and completely with reference to the drawings in the embodiments of the present disclosure. It is obvious that the described embodiments are only some instead of all embodiments of the present disclosure. All other embodiments obtained by a person of ordinary skill in the art based on the embodiments in the present disclosure without making any inventive effort belong to the protection scope of the present disclosure.

The present disclosure provides an electroluminescent display panel, a method for manufacturing the same, and a display device, wherein an elastic region is provided in a bending region of the electroluminescent display panel, and an elastic member is filled in the elastic region, so that a bendable degree of the electroluminescent display panel is improved, the problem of device breakage due to bending is addressed, and the product yield is improved.

Figure 1:
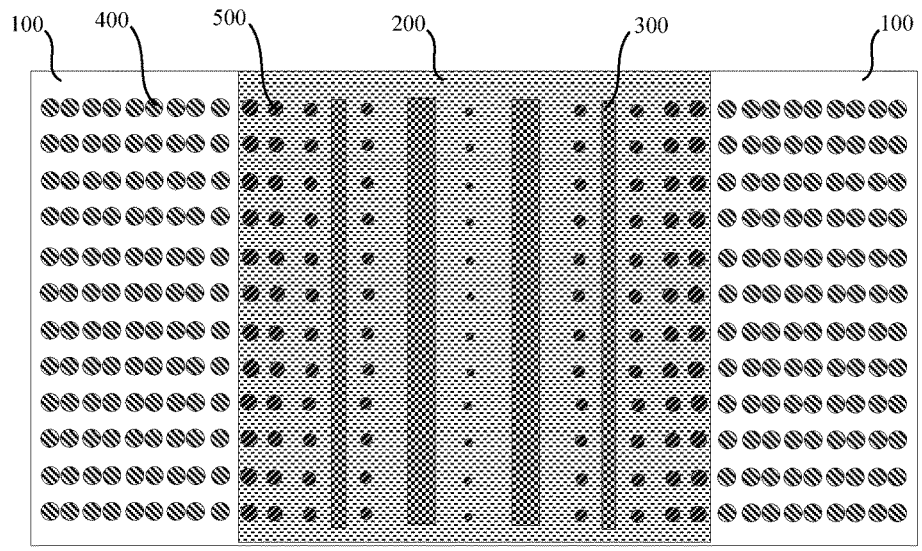
FIG. 1 is a schematic structural diagram of an electroluminescent display panel according to the present disclosure.
Figure 3D:
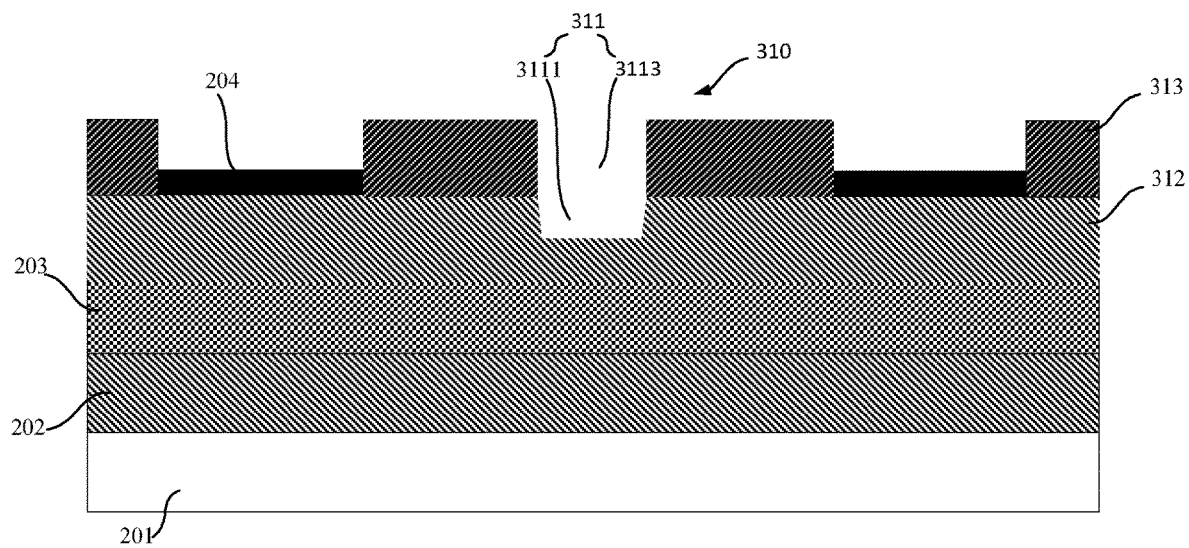
Figure 3D:
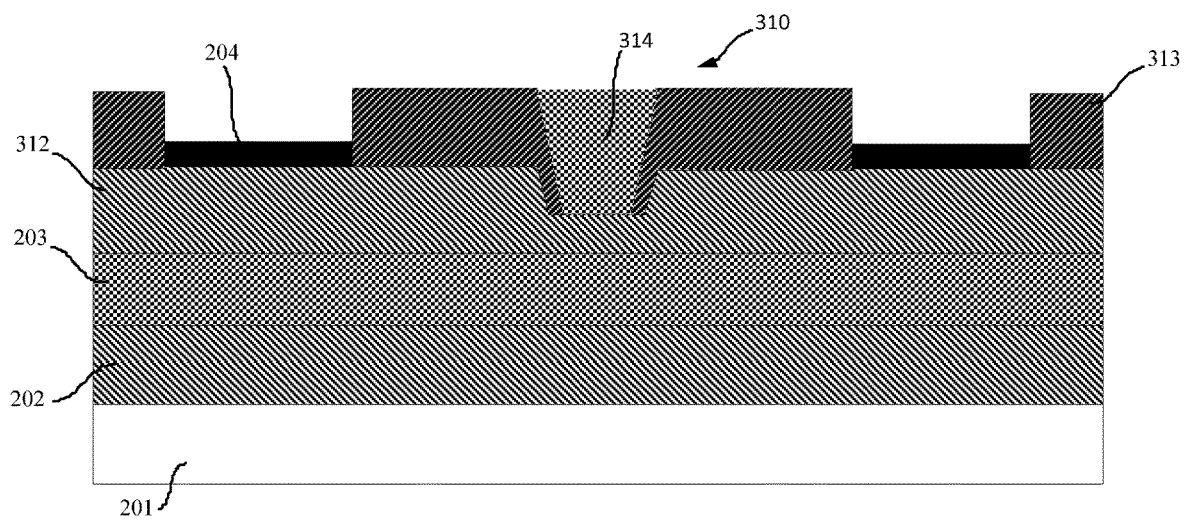
Figure 3E:
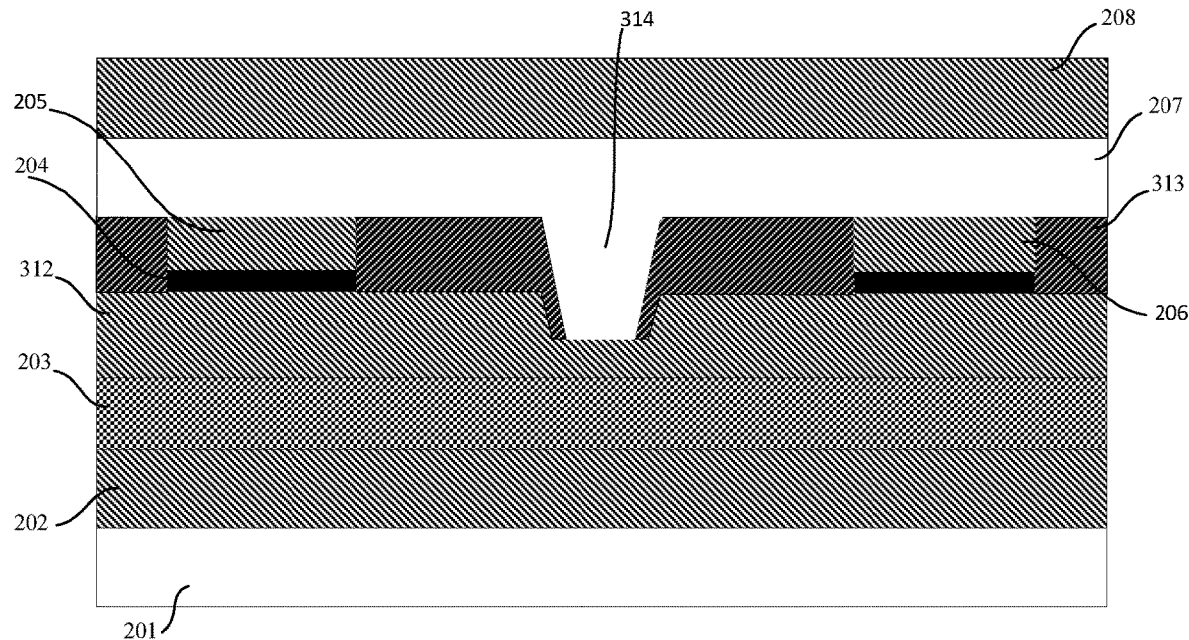
Figure 3F:
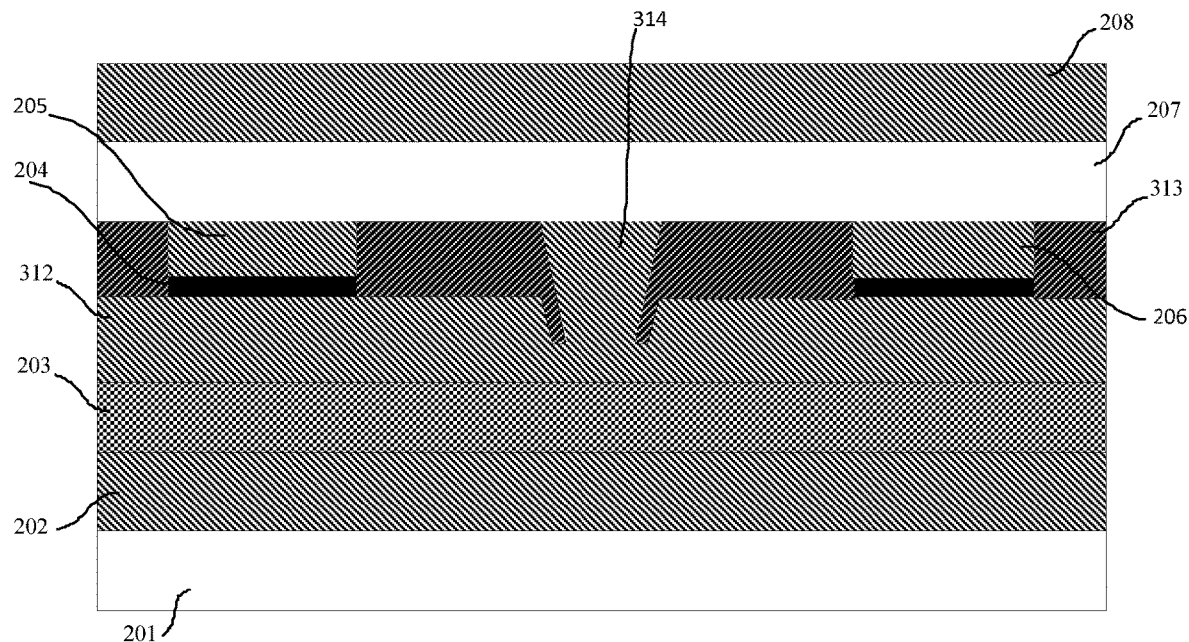
Figure 4:
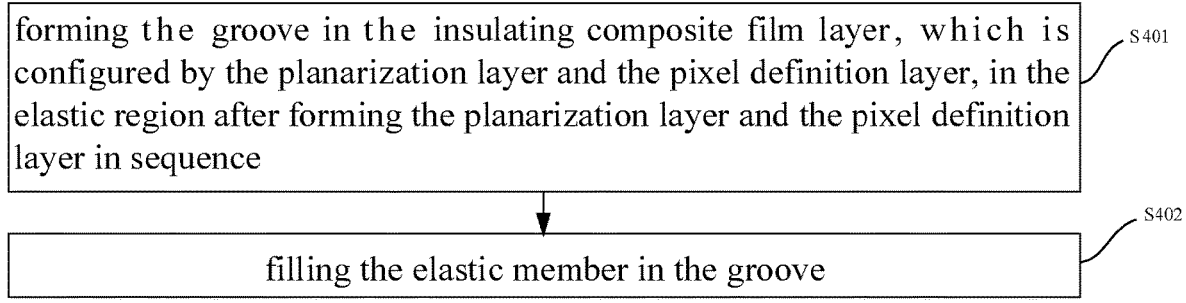
FIG. 4 is a flowchart of a method for manufacturing the electroluminescent display panel according to the present disclosure.

As shown in FIG. 1 and FIG. 3f, an electroluminescent display panel comprises a non-bending region 100 and a bending region 200, wherein a plurality of first pixels 400 arranged in an array are provided in the non-bending region 100, a plurality of second pixels 500 arranged in an array are provided in the bending region 200, and an open area of the second pixels 500 is smaller than that of the first pixels 400; in the bending region 200, at least one elastic region 300 with an extending direction consistent with a bending axis direction is provided at a gap of the second pixels 500 along a direction perpendicular to the bending axis direction, a groove 311 is provided in an insulating composite film layer 310 in each of the elastic region 300, and the insulating composite film layer 310 comprises a planarization layer 312 and a pixel definition layer 313 positioned over the planarization layer 312; an elastic member 314 is filled in the groove 311, and the elastic member 314 has an elastic modulus greater than that of the planarization layer 312. For example, if the bending axis direction is a longitudinal direction, at least one elastic region 300 with the extending direction which is the longitudinal direction is provided at a gap of the second pixels 500 along the transverse direction. In another example, if the bending axis direction is a transverse direction, at least one elastic region 300 with the extending direction which is the transverse direction is provided at a gap of the second pixels 500 along the longitudinal direction.

In the above electroluminescent display panel, the plurality of first pixels 400 are arranged in an array, which are distributed uniformly, and the open area of the first pixels 400 is fixed, and since the open area of the second pixels 500 is smaller than that of the first pixels 400, the area of a region for arranging the second pixels 500 in the whole electroluminescent display panel is reduced, thereby ensuring that there is a certain space for providing the elastic region 300 in the bending region 200, and since the groove 311 is provided in the insulating composite film layer 310 in each of the elastic region 300, the elastic member 314 is filled in the groove 311, and the elastic modulus of the elastic member 314 is greater than that of the planarization layer 312, so that the elastic region 300 has better bending performance than other portions of the bending region 200, thereby improving the bendable degree of the whole electroluminescent display panel at time of bending, addressing the problem of device fracture due to bending, and improving the yield of the product.

For example, at the time of providing, the groove 311 may have the following two structural forms:

firstly, as shown in FIG. 3c2, in the elastic region 300, the planarization layer 312 has a first groove 3111, the pixel definition layer 313 has a through hole 3113, and the groove 311 includes the first groove 3111 and the through hole 3113;

second, as shown in FIG. 3c1, in the elastic region 300, the planarization layer 312 has a first groove 3111, the pixel definition layer 313 has a second groove 3112, and the groove 311 includes the first groove 3111 and the second groove 3112.

In the above electroluminescent display panel, the open area of the second pixels 500 is set to be smaller than that of the first pixels 400, so as to further reduce the open area of the second pixels 500 of the OLED, thereby increasing the area of a region for forming the elastic region 300 in the bending region 200, and the increase of the area of the elastic region 300 can cause the region for buffering the bending stress at the time of bending to be larger, thereby improving the bendable performance of the elastic region 300, and thus improving the bendable degree of the whole electroluminescent display panel at the time of bending.

Figure 2A:
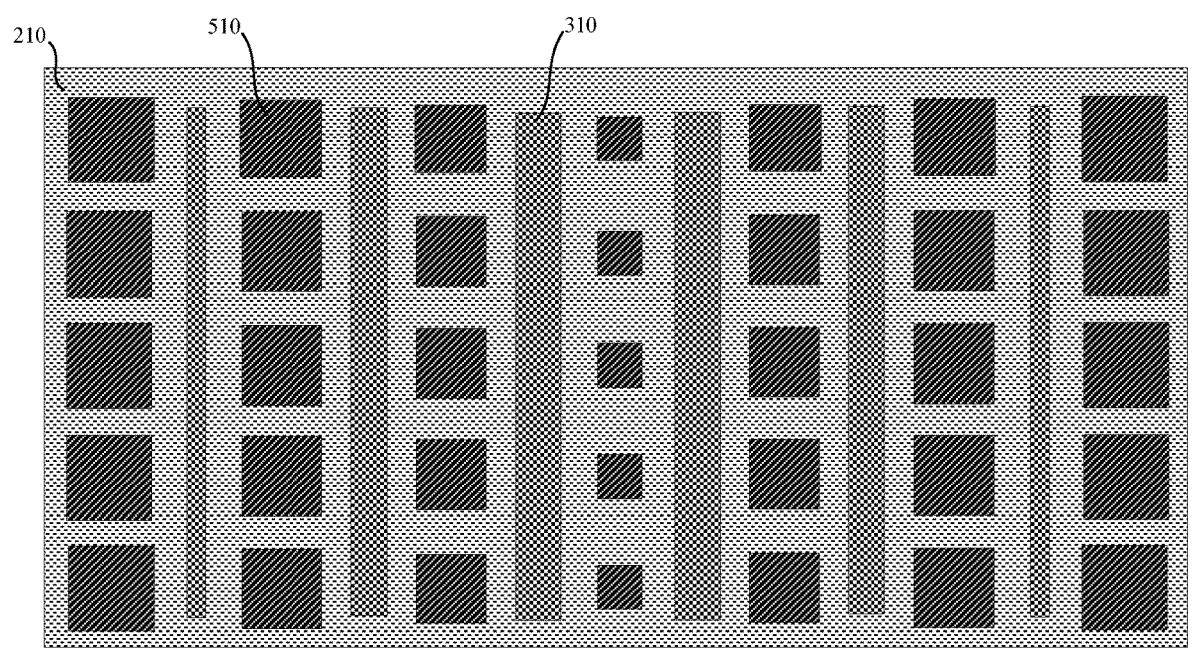
FIGS. 2a-2c are schematic diagrams illustrating the distribution of pixels in a bending region of the electroluminescent display panel according to the present disclosure.

For example, at the time of setting, a distribution of the open area of the second pixels 500 may have the following manners:

Manner I: as shown in FIG. 2a, in the bending region 210, the open area of the second pixels 510 which are closer to the bending axis is gradually decreased, and the open area of the groove 311 which is closer to the bending axis is gradually increased, that is, the area of the elastic region 300 is gradually increased.

In the above-mentioned electroluminescent display panel, the open area of the second pixels 510 of the bending region 210 is sequentially reduced along a direction close to the bending axis, the open area of the first pixels 400 of the non-bending region 100 in the whole electroluminescent display panel is fixed, the open area of the second pixels 510 in the bending region 210 adjacent to the first pixels 400 of the non-bending region 100 is the largest, and the open area of the second pixels 510 located at the center of the bending region 210 is the smallest, and accordingly, the area of the elastic region 300 in the bending region 210 closest to the non-bending region 100 is the smallest, and the area of the elastic region 300 located at the center of the bending region 210 is the largest. Since the bending deformation borne by the center of the bending region 210 is the largest at the time of bending, by setting the area of the elastic region 300 located at the center of the bending region 210 to be the largest, so as to buffer the bending stress to a greater extent, it is ensured that the bending region 210 is uniformly stressed at the time of bending, the bendable performance of the elastic region 300 is improved, and the service life of the electroluminescent display panel is further improved.

Figure 2B:
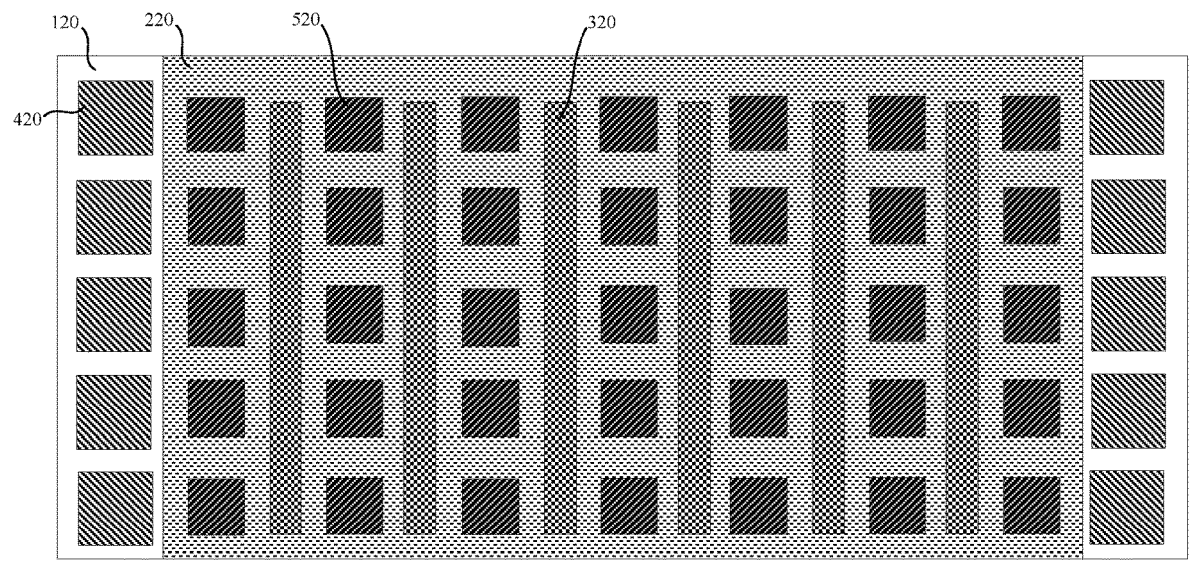

Manner II: as shown in FIG. 2b, in the bending region 220, the respective second pixels 520 have a uniform open area, the elastic region 320 is provided between the adjacent second pixels 520, and the respective grooves 311 have a uniform open area.

In the above-mentioned electroluminescent display panel, the open area of the second pixels 520 of the bending regions 220 are set to be the same, the open area of the second pixels 520 of the bending region 220 is smaller than that of the first pixels 420 of the non-bending region 120, the elastic regions 320 with the same size are provided between the adjacent second pixels 520 of the bending region 220, and the second pixels 520 and the elastic regions 320 are distributed in the bending region 220 at intervals, so that the electroluminescent display panel can be conveniently manufactured during the manufacturing process, the overall brightness of the bending region 220 can be conveniently controlled, and the overall brightness uniformity in the bending region 220 can be easily realized.

Figure 2C:
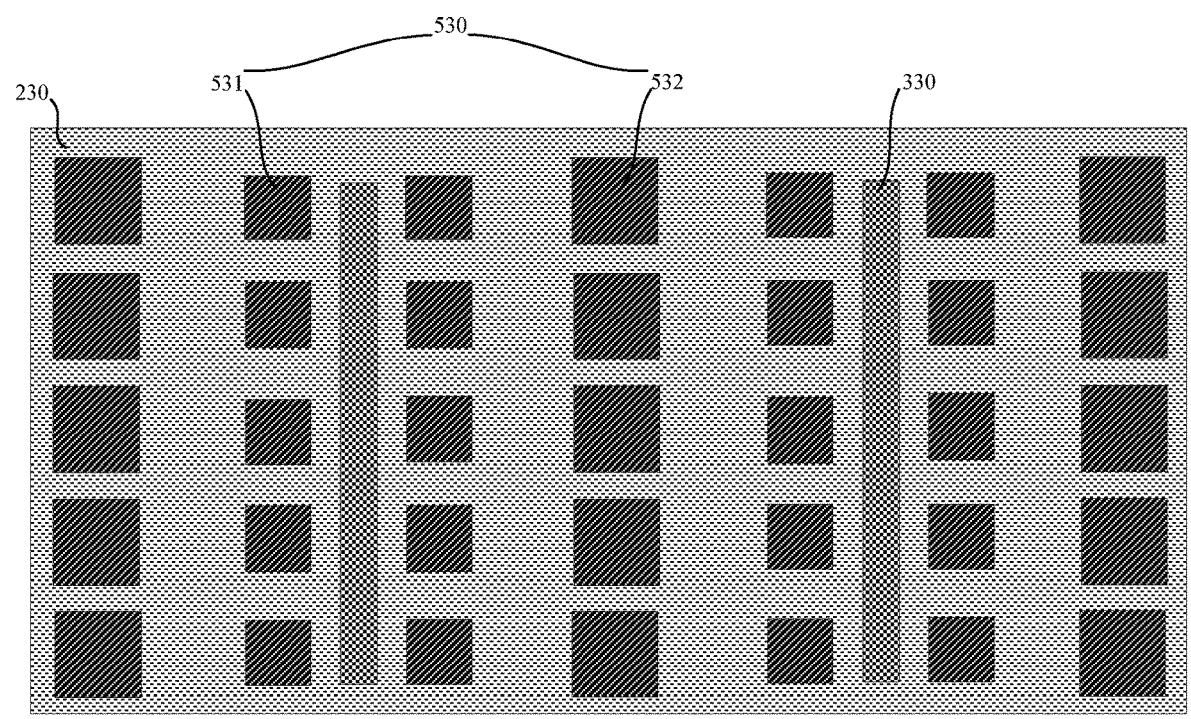

In order to ensure the color continuity of the display screen of the whole electroluminescent display panel, according to the embodiment of the present disclosure, as shown in FIG. 2c, third pixels 532 having the same open area as that of the first pixels are further arranged in the bending region 230, an elastic region 330 is provided between two adjacent groups of the second pixels 531 along a direction consistent with the bending axis direction, and the respective groups of the third pixels 532 and the grooves 311 along the direction consistent with the bending axis direction are alternately provided at the gaps of the respective groups of the second pixels 531 along the direction consistent with the bending axis direction. For example, if the bending axis direction is the longitudinal direction, the respective columns of the third pixels 532 and the grooves 311 along the longitudinal direction are alternately provided at the gaps of the respective columns of the second pixels 531 along the longitudinal direction. In another example, if the bending axis direction is the transverse direction, the respective rows of the third pixels 532 and the grooves 311 along the transverse direction are alternately provided at the gaps of the respective rows of the second pixels 531 along the transverse direction.

In the above-mentioned electroluminescent display panel, two adjacent columns of the second pixels 531 may be set as pixels with the same color, and the open area of each of the second pixels 531 is set to be approximately half of the open area of the third pixels 532, so that the color effect of the region configured by the two adjacent columns of the second pixels 531 may be approximately equivalent to the color effect when the elastic region 330 is not provided in the original position, thereby avoiding the color discontinuity of the display screen of the electroluminescent display panel due to the providing of the elastic region 330, and this providing method can ensure the display effect well.

In the above-mentioned electroluminescent display panel, the open area of the second pixels 531 is not larger than the open area of the first pixels 400. In order to ensure the uniformity of the display brightness, a current density of the second pixels 531 with the small open area should be increased, thereby increasing the brightness thereof. However, in order to avoid burning out of the second pixels 531 due to excessive current, the size of the open area of the pixels at the middle of the bending region 230 should be controlled, and the size of the open area of the pixels at the middle of the bending region 230 can be reduced to 30% of the open area of the first pixels 400 at maximum.

In order to ensure the brightness uniformity of the display screen of the whole electroluminescent display panel, according to the embodiment of the present disclosure, the first pixels 400 and the second pixels 500 are respectively connected to different driving chips.

In the above-mentioned electroluminescent display panel, since the open area of second pixels 500 is different from the open area of first pixels 400, different driving chips are provided to facilitate the controlling of the pixels having the different open area. A driving chip drives the bending region 200 to control the density of first pixels 400, thereby enhancing brightness and ensuring a uniform brightness over the bending region 200. Another driving chip controls the non-bending region 100 to control the magnitude of the current of the second pixels 500, thereby ensuring a uniform brightness over the non-bending area 100. The different driving chips operate independently from each other to ensure the color continuity and the brightness uniformity of the display screen of the whole electroluminescent display panel.

According to the embodiment of the present disclosure, a material of the planarization layer 312 is polyimide, and a material of the elastic member 314 is modified polyimide. In the above-mentioned electroluminescent display panel, the elastic member 314 is filled in the groove 311, and an elastic modulus of the modified polyimide is greater than that of the polyimide, so that the bendable performance of the groove 311 filled with the elastic member 314 in the elastic region 300 is different from that of the planarization layer 312.

A material of the elastic member 314 may be modified polyimide, carbon fiber, or other material satisfying the above requirements. The modified polyimide may be selected from a group consisting of random block co-polycondensation polyimide, aminated polyimide/multi-walled carbon nanotube (PI/MWNTs) nanocomposite, polyimide containing benzoxazole structural units, silicon carbide reinforced polyimide, graphene/polyimide and the like.

According to the embodiment of the present disclosure, the material of the elastic member 314 is the same as that of a flexible encapsulation film layer. Since the elastic modulus of the material of the flexible encapsulation film layer is greater than that of the material for manufacturing the planarization layer 312, it is not necessary to perform filling in the groove 311 in advance at the time of the manufacturing, and it is possible to manufacture the flexible encapsulation film layer directly.

Of course, the planarization layer 312 may be manufactured from the other material in addition to the polyimide. After the material of the planarization layer 312 is selected, it is only necessary to limit the elastic modulus of the elastic member 314 to be greater than the elastic modulus of the material from which the planarization layer 312 is manufactured, so as to improve the bendable performance of the bending region 200, and further improve the bendable performance of the whole electroluminescent display panel.

In addition, the present disclosure also provides a display device comprising the electroluminescent display panel according to any of the above technical solutions.

In the above-mentioned display device, the elastic region is provided in the bending region of the electroluminescent display panel, and the elastic member is filled in the elastic region, so that the bendable degree of the electroluminescent display panel is improved, the problem of device breakage due to bending is addressed, and the product yield is improved. Therefore, the bendable performance of the display device with the electroluminescent display panel is good, and the product yield is high.

In addition, as shown in FIGS. 3a to 3c, 3e and 4, the present disclosure further provides a method for manufacturing the electroluminescent display panel according to any one of the above technical solutions, comprising:

step S401, forming the groove 311 in the insulating composite film layer 310, which is configured by the planarization layer 312 and the pixel definition layer 313, in the elastic region 300 while forming the planarization layer 312 and the pixel definition layer 313 in sequence; and step S402, filling the elastic member 314 in the groove 311.

In the above-mentioned method for manufacturing the electroluminescent display panel, the characteristics of the substrate for carrying the organic layer 205, the cathode layer 206 and the flexible encapsulation film layer 207 are changed to cause the bendable performance of the substrate at different positions to be different, thereby improving the bendable degree of the whole electroluminescent display panel and addressing the problem of device breakage due to bending. The specific process is as follows: firstly, a flexible substrate 202 is manufactured on a rigid substrate 201, wherein the rigid substrate 201 can be a metal plate, an acrylic plate, glass or the like which has good flatness, and the material of the flexible substrate 202 can be one or a mixture of more of polyimide, polyethylene, polypropylene, polystyrene, polyether sulfone resin, polyethylene naphthalate, polyethylene terephthalate, polycarbonate, polyarylate and fiber reinforced plastics; the flexible substrate 202 is formed by depositing the above-mentioned material on the rigid substrate 201, and a thin film transistor circuit 203 for controlling the operation of the pixels is manufactured on the flexible substrate 202; and then, by step S401, as shown in FIGS. 3a to 3c, the planarization layer 312 is manufactured over the thin film transistor circuit 203 for planarization, wherein the planarization layer 312 serves as an insulator to reduce interference between the anode and the thin film transistor circuit 203; and then an anode layer 204 is formed, wherein the material of the anode layer 204 can be ITO (indium tin oxide); the pixel definition layer 313 is manufactured after the manufacturing of the anode layer 204 is completed, and the groove 311 is formed in the insulating composite film layer 310 configured by the planarization layer 312 and the pixel definition layer 313; and then, by step S402, the elastic member 314 is filled in the groove 311; and finally, as shown in FIG. 3e, the organic layer 205, the cathode layer 206 and the flexible encapsulation film layer 207 are formed in sequence, the rigid substrate 201 is peeled off after encapsulation, and then a membrane 208 is assembled, so that the flexible and bendable electroluminescent display panel is manufactured.

According to the embodiment of the present disclosure, forming the groove 311 in the insulating composite film layer 310, which is configured by the planarization layer 312 and the pixel definition layer 313, in the elastic region 300 comprises:

forming the planarization layer 312 having a first groove 3111 in the elastic region 300;

forming the pixel definition layer 313 having the second groove 3112 or the through hole 3113 in the elastic region 300.

In the above-mentioned method for manufacturing the electroluminescent display panel, as shown in FIGS. 3b and 3c, a first groove 3111 is firstly manufactured in the planarization layer 312, and then the pixel definition layer 313 is manufactured. For the convenience of manufacturing the second groove 3112 or the through hole 3113, a mask may be added at the time of manufacturing the pixel definition layer 313 to perform exposure, development, etching and curing, and the second groove 3112 or the through hole 3113 is formed by controlling an amount of the exposure at the first groove 3111.

According to the embodiment of the present disclosure, the elastic member 314 may be filled in the groove 311 in the following two manners:

in a first manner, after the manufacturing of the pixel definition layer 313 is completed, as shown in FIG. 3d, the elastic member 314 is separately formed only in the groove 311, and the elastic member 314 is filled in advance, wherein the material of the elastic member 314 may be the modified polyimide or the like, so that the bendable performance of the elastic region 300 is better than that of the planarization layer 312, thereby improving the bendable performance of the bending region 200, and further improving the bendable performance of the whole electroluminescent display panel, and in this manner, the bendable performance of the elastic region 300 can be changed by changing the filled elastic member 314 to be different;

in the second manner, as shown in FIG. 3e, the elastic member 314 is formed in the groove 311 while the flexible encapsulation film layer 207 is formed, and the flexible encapsulation film layer 207 is directly formed without filling other substances in the first groove 3111 in advance, and the elastic member 314 is formed of the material of the flexible encapsulation film layer 207 filled in the groove 311. The manufacturing process in this manner is simple and easy to implement.

It will be apparent to those skilled in the art that various modifications and variations can be made in the embodiments of the present disclosure without departing from the spirit and scope of the present disclosure. Thus, if such modifications and variations of the present disclosure fall within the scope of the claims of the present disclosure and equivalents thereof, the present disclosure is intended to include such modifications and variations as well.

What is claimed is:

1. An electroluminescent display panel comprising a bending region and a non-bending region, wherein a plurality of first pixels arranged in an array are provided in the non-bending region, a plurality of second pixels arranged in an array are provided in the bending region, and an open area of the second pixels is smaller than that of the first pixels; in the bending region, at least one elastic region with an extending direction consistent with a bending axis direction is provided at a gap of the second pixels along a direction perpendicular to the bending axis direction, a groove is provided in an insulating composite film layer in each of the elastic region, and the insulating composite film layer comprises a planarization layer and a pixel definition layer positioned over the planarization layer; and an elastic member is filled in the groove, and the elastic member has an elastic modulus greater than that of the planarization layer.

2. The electroluminescent display panel of claim 1, wherein
in the elastic region, the planarization layer has a first groove, and the pixel definition layer has a through hole; or
in the elastic region, the planarization layer has a first groove, and the pixel definition layer has a second groove.

3. The electroluminescent display panel according to claim 1, wherein in the bending region, the open area of the second pixels decreases as the second pixels approach the bending axis, and the open area of the groove increases as the groove approaches the bending axis; or in the bending region, the respective second pixels have a uniform open area, and the respective grooves have a uniform open area.

4. The electroluminescent display panel according to claim 1, wherein third pixels having the same open area as the first pixels are further provided in the bending region, and respective groups of the third pixels and the grooves along a direction consistent with the bending axis direction are alternately provided at gaps of the respective groups of the second pixels along a direction consistent with the bending axis direction.

5. The electroluminescent display panel of claim 1, wherein the first pixels and the second pixels are respectively connected to different driving chips.

6. The electroluminescent display panel of claim 1, wherein a material of the planarization layer is polyimide, and a material of the elastic member is modified polyimide.

7. The electroluminescent display panel of claim 1, wherein a material of the elastic member is the same as that of a flexible encapsulation film layer.

8. A display device comprising the electroluminescent display panel according to claim 1.

9. A method for manufacturing an electroluminescent display panel comprising a bending region and a non-bending region, wherein a plurality of first pixels arranged in an array are provided in the non-bending region, a plurality of second pixels arranged in an array are provided in the bending region, and an open area of the second pixels is smaller than that of the first pixels; in the bending region, at least one elastic region with an extending direction consistent with a bending axis direction is provided at a gap of the second pixels along a direction perpendicular to the bending axis direction, a groove is provided in an insulating composite film layer in each of the elastic region, and the insulating composite film layer comprises a planarization layer and a pixel definition layer positioned over the planarization layer; and an elastic member is filled in the groove, and the elastic member has an elastic modulus greater than that of the planarization layer, the method comprising:

forming the groove in the insulating composite film layer, which is configured by the planarization layer and the pixel definition layer, in the elastic region while forming the planarization layer and the pixel definition layer in sequence; and filling the elastic member in the groove.

10. The method according to claim 9, wherein forming the groove in the insulating composite film layer, which is configured by the planarization layer and the pixel definition layer, in the elastic region comprises:

forming the planarization layer having a first groove in the elastic region; and forming the pixel definition layer having a second groove or a through hole in the elastic region.

11. The method according to claim 9, wherein filling the elastic member in the groove comprises:

separately forming the elastic member only in the groove after the pixel definition layer is manufactured; or forming the elastic member in the groove while forming a flexible encapsulation film layer.

\* \* \* \* \*